United States Patent [19]
Tanzawa et al.

[11] Patent Number: 6,084,799
[45] Date of Patent: Jul. 4, 2000

[54] NONVOLATILE SEMICONDUCTOR MEMORY HAVING IMPROVED SOURCE LINE DRIVE CIRCUIT

[75] Inventors: Toru Tanzawa, Ebina; Tomoharu Tanaka, Yokohama, both of Japan

[73] Assignee: Kabushiki Kaisha Toshiba, Kawasaki, Japan

[21] Appl. No.: 08/976,492

[22] Filed: Nov. 24, 1997

[30] Foreign Application Priority Data

Nov. 25, 1996 [JP] Japan ..................................... 8-313639

[51] Int. Cl.⁷ .................................................. G11C 16/06
[52] U.S. Cl. ............................... 365/185.23; 365/185.05; 365/185.11
[58] Field of Search .......................... 365/185.23, 185.11, 365/185.33, 230.06, 185.05

[56] References Cited

U.S. PATENT DOCUMENTS

| | | | |
|---|---|---|---|
| 5,371,697 | 12/1994 | Yamada | 365/49 |
| 5,400,287 | 3/1995 | Fuchigami | 365/218 |
| 5,402,382 | 3/1995 | Miyawaki et al. | 365/218 |
| 5,546,341 | 8/1996 | Suh et al. | 365/185.33 |
| 5,608,671 | 3/1997 | Ninomiya | 365/185.29 |
| 5,696,717 | 12/1997 | Koh | 365/185.22 |
| 5,706,229 | 1/1998 | Yabe et al. | 365/189.05 |
| 5,838,603 | 11/1998 | Mori et al. | 365/63 |

OTHER PUBLICATIONS

K. Suh et al. "A 33 V 32 Mb Nand Flash Memory With Incremental Step Pulse Programming Scheme," ISSCC Digest of Technical Papers, pp 128–129, Feb. 1995.

Iwata. Y. et al.; "A 35ns Cycle Time 3.3V Only 32 Mb NAND Flash EEPROM" IEEE Journal of Solid–State Circuits: vol. 30, No. 11, pp. 1157–1164 Nov.1995.

Bauer. M. et al; "A Multilevel–Cell 32 Mb Flash Memory" 1995 ISSCC Digest of Technical Papers; pp. 132–133 Nov. 1995.

T.S. Jung; "A 33V 128 Mb Multi–Level NAND Flash Memory for Moss Storage Applications", 1996 ISSCC Digest of Technical Papers, pp. 32–33. Feb. 1995.

*Primary Examiner*—Richard Elms
*Assistant Examiner*—Hien Nguyen
*Attorney, Agent, or Firm*—Banner & Witcoff, Ltd.

[57] ABSTRACT

A nonvolatile semiconductor memory, having an improved source line drive circuit, comprises a memory core section including a memory cell array, a control circuit, the memory cell array having a plurality of memory cells respectively, constituted by transistors of layered gate structure having source electrodes, and each of the memory cells being connected to a common word line and a corresponding signal line. The control circuit senses a signal line voltage in accordance with data of the corresponding memory cell, and amplifies the signal line voltage to output a signal. The source electrodes of the plurality of the memory cells are connected to the source diffusion layer in common. A peripheral circuit includes a source line drive circuit for controlling a potential of each source line to be maintained substantially constant.

20 Claims, 7 Drawing Sheets

NONVOLATILE SEMICONDUCTOR MEMORY HAVING IMPROVED SOURCE LINE DRIVE CIRCUIT

BACKGROUND OF THE INVENTION

The present invention relates to a nonvolatile semiconductor memory such as a flash type EEPROM, and more particularly to a nonvolatile semiconductor memory having an improved source line drive circuit capable of setting a potential of a source line to a fixed range regardless of a pattern of read data so as to prevent erroneous data from being read.

FIG. 1 shows a main part of the structure of a conventional nonvolatile semiconductor memory such as a flash type EEPROM. A surface of a memory chip 1 is occupied by a memory core section 2, and a peripheral circuit section other than the memory core section 2. The memory core section 2 comprises a memory cell array 3, a row decoder 4, and a bit line control circuit 5 including a sense amplifier 20 (FIG. 2) and a bit line charge circuit.

A row address signal is output from an address register 6 to be supplied to the row decoder 4 and a word line drive circuit 7. The row decoder 4 and the word line drive circuit 7 select a predetermined row of the memory cell array 3 based on a control signal from a command register 8, and apply a high potential to the selected predetermined row.

A column address signal is output to a column decoder 9 from the address register 6. The column decoder 9 selects a predetermined column of a memory cell array 3. Then, a bit line of the selected predetermined column and an I/O buffer 10 are connected to each other.

A well voltage control circuit 11 sets a voltage of a well where a memory cell is formed to a predetermined value based on the control signal from the command register 8. A source line drive circuit 12 sets a voltage VS of a source of the memory cell to a predetermined value based on the control signal from the command register 8.

FIG. 2 is an example of the structure of a conventional source line drive circuit.

The source line drive circuit 12 comprises an N channel MOS transistor 13. A control signal CR is applied to a gate of the MOS transistor 13. A source of the MOS transistor 13 is connected to a ground terminal GND (VSS). A drain source is connected to a source line 14.

The source line 14 is formed of metal such as aluminum. A wire resistor (including wire resistor of polysilicon wire used to intersect with a source line) 15 is provided between the MOS transistor 13 and the source line 14.

Memory cells 16 share one word line (control gate electrode) 18. Also, the memory cells 16 share one source diffusion layer 17. The source diffusion layer 17 is formed in a line manner in the row direction where the word line extends. Also, the source diffusion layer 17 contacts the source line 14 at a plurality of portions.

Drain diffusion layers of the memory cells 16 are connected to bit lines 19. The bit lines 19 are connected to sense amplifiers 20. Constant current sources 21 are connected between the bit lines 19 and power source terminals VDD, respectively to constitute the bit line control circuit 5.

In the above-explained nonvolatile semiconductor memory, an operation of each of data reading, writing, and is described in, for example, IEEE J. Solid-State Circuits, vol. 30, pp.1157–1164, November 1995.

The following will briefly explain the operation of data reading:

Specifically, the row address signal is decoded by the row decoder 4, a high potential (e.g. 5V) is applied to a predetermined word line 18. Also, the bit lines 19 are charged by the constant current sources 21.

In a state that data of the memory cells is "0", that is, an electron is stored in a floating electrode, a threshold value of each of the memory cells exceeds 5V. Due to this, even if the high potential is applied to the word line 18, each memory cell is not turned on.

As a result, each bit line 19 is maintained to be high potential (data "0"), and the high potential is guided to the I/O buffer 10 via the sense amplifier 20.

At the data reading operation time, almost all data is "1", almost all memory cells connected to the selected word line are turned on.

At this time, a large amount of current flows to the source line 14. As a result, the potential of the source line 14 rises due to the presence of the wire resistor 15 (including wire resistor of polysilicon wire).

Thus, if the potential of the source line 14 varies, the threshold voltages of the memory cells change. As a result, a read disturb characteristic is deteriorated. For example, FIG. 3 shows a state that the threshold voltage of a certain noticing memory cell is varied by data patterns of the other memory cells, which are connected to the same word line when the memory cells of 4096 bits (512 bytes per one word line) are connected to the word line.

If all data of the other memory cells is "0", no current flows. Due to this, the voltage of the source line connected to these memory cells does not rise, so that an apparent threshold voltage (Vt1) of the noticing memory cell is relatively low.

If all data of the other memory cells is "1", the current flowing to the source line 14 is increased in accordance with an increase in the number of data "1." As a result, the apparent threshold voltage of the noticing memory cell is increased by the rise of the voltage of the source line 14 and a body effect of the memory cell transistors. The value of the threshold voltage reaches the maximum (Vt2) when all memory cells other than the noticing memory cell are "1".

Thus, the threshold voltage of the noticing memory cell can be varied by "Vt2−Vt1=dVt" by the data patterns of the other memory cells. If the value of dVt is large, the following error will occur:

More specifically, data is erroneously regarded as "1" at the time of threshold voltage Vt1, or data is erroneously regarded as "0" at the time of the threshold voltage Vt2.

As a result, a reading defect will occur. Due to this, it has been necessary to take a larger value (margin) as data ("1", "0") threshold voltage level difference than the value of dVt, which is varied by the data patterns of the other memory cells, without being influenced by the value of dVt. However, to take such a large margin, the rise of the read voltage has been needed. As a result, the so-called read disturb characteristic has been worsened.

BRIEF SUMMARY OF THE INVENTION

An object of the present invention is to provide a nonvolatile semiconductor memory such as a flash type EEPROM having an improved source line drive circuit capable of setting a potential of a source line to a fixed range regardless of a pattern of read data ("1", "0").

To attain the above object, according to the present invention, there is provided a nonvolatile semiconductor memory having an improved source line drive circuit, comprising:

a memory core section including a memory cell array and a control circuit, the memory cell array having a plurality of memory cells respectively constituted by transistors of layered gate structure having source electrodes, and each of the memory cells being connected to a common word line and a corresponding signal line; the control circuit sensing a signal line voltage in accordance with data of the corresponding memory cell, and amplifying the signal line voltage to output a signal; and the source electrodes of the plurality of memory cells being connected to a source line in common; and a peripheral circuit section including a source line drive circuit for maintaining a potential of the source line to be substantially constant.

Also, according to the present invention, there is provided a nonvolatile semiconductor memory having an improved source line drive circuit, comprising:

a memory core section including a memory cell array and a control circuit, the memory cell array having a plurality of memory cells constituted by transistors of layered gate structure having source electrodes, and each of the memory cells being connected to a common word line and a corresponding signal line; the control circuit sensing a signal line voltage in accordance with data of the corresponding memory cell, and amplifying the signal line voltage to output a signal; and the source electrodes of the plurality of memory cells being connected to a source line in common; and a peripheral circuit section including a source line drive circuit for controlling the source line, the source line drive circuit, connected to the source line to supply a predetermined potential to the source line, comprising a potential monitor section for monitoring a potential of the source line, and a drive section controlled by an output signal from the monitor section, the potential monitor section comprising:
  a first operational amplifier having a positive input terminal to which the potential of the source line is applied and a negative input terminal to which a first reference potential is applied; a second operational amplifier having a positive input terminal to which the potential of the source line is applied and a negative input terminal to which a second reference potential is applied; and
  the drive section comprising a first transistor having a gate which an output signal of the first operational amplifier is applied, a source connected to a first power source terminal, and a drain connected to the source line; and a second transistor having a gate which an output signal of the second operational amplifier is applied, a source connected to a second power source terminal, and a drain connected to the source line.

Moreover, according to the present invention, there is provided a nonvolatile semiconductor memory having an improved source line drive circuit, comprising:

a memory cell array;

a row decoder for selecting a predetermined row of the memory cell array;

a source line drive circuit, having a potential monitor section and a drive section, for controlling a source line connected to a source diffusion layer of the memory cell array to be a predetermined potential, the source line drive circuit setting a potential of the source line within a range between first and second reference potentials at a data reading time regardless of data of a memory cell belonging to the predetermined row; and a sense amplifier for amplifying a potential of a signal line connected to a drain diffusion layer of the memory cell array.

Moreover, according to the present invention, there is provided a voltage control circuit comprising:

a current source for outputting a current flowing from a supply voltage terminal to a first node, a voltage monitor circuit connected to the first node, being inputted a first voltage at the first node and a second voltage having a predetermined value, and outputting a third voltage depending upon a voltage difference between the first and second voltages, and a driver circuit for controlling the first voltage by decreasing the first voltage in case that the first voltage is higher than the second voltage or increasing the first voltage when the first voltage is lower than the second voltage.

Moreover, according to the present invention, there is provided a nonvolatile semiconductor memory having an improved source line drive circuit, comprising:

a memory core section including a memory cell array and a control circuit, the memory cell array having a plurality of memory cells respectively constituted by transistors of layered gate structure having source electrodes, and each of the memory cells being connected to a common word line and a corresponding signal line; the control circuit sensing a signal line voltage in accordance with data of the corresponding memory cell, and amplifying the signal line voltage to output a signal; and the source electrodes of the plurality of memory cells being connected to a source line in common; and a peripheral circuit section including
  a voltage control circuit which comprises
    a current source for outputting a current flowing from a supply voltage terminal to a first node,
    a voltage monitor circuit connected to the first node, and being inputted a first voltage at the first node and a second voltage having a predetermined value, and outputting a third voltage depending upon a voltage difference between the first and second voltages, and
    a driver circuit for controlling the first voltage by decreasing the first voltage when the first voltage is higher than the second voltage or increasing the first voltage when the first voltage is lower than the second voltage,
    wherein the current source outputs a current depending upon the data pattern of the plurality of memory cells.

According to the above-explained nonvolatile semiconductor memory having the improved source line drive circuit, the source line drive circuit comprises the monitor section, and the drive section. The monitor section monitors the potential of the source line, and the drive section sets the source line to a predetermined potential based on the output signal of the monitor section. As a result, the potential of the source line can be set to a fixed range regardless of the pattern of read data ("1", "0"). Therefore, the margin for recognizing the level of read data can be sufficiently ensured to prevent erroneous data reading.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to the accompanying drawings.

Figure 4:
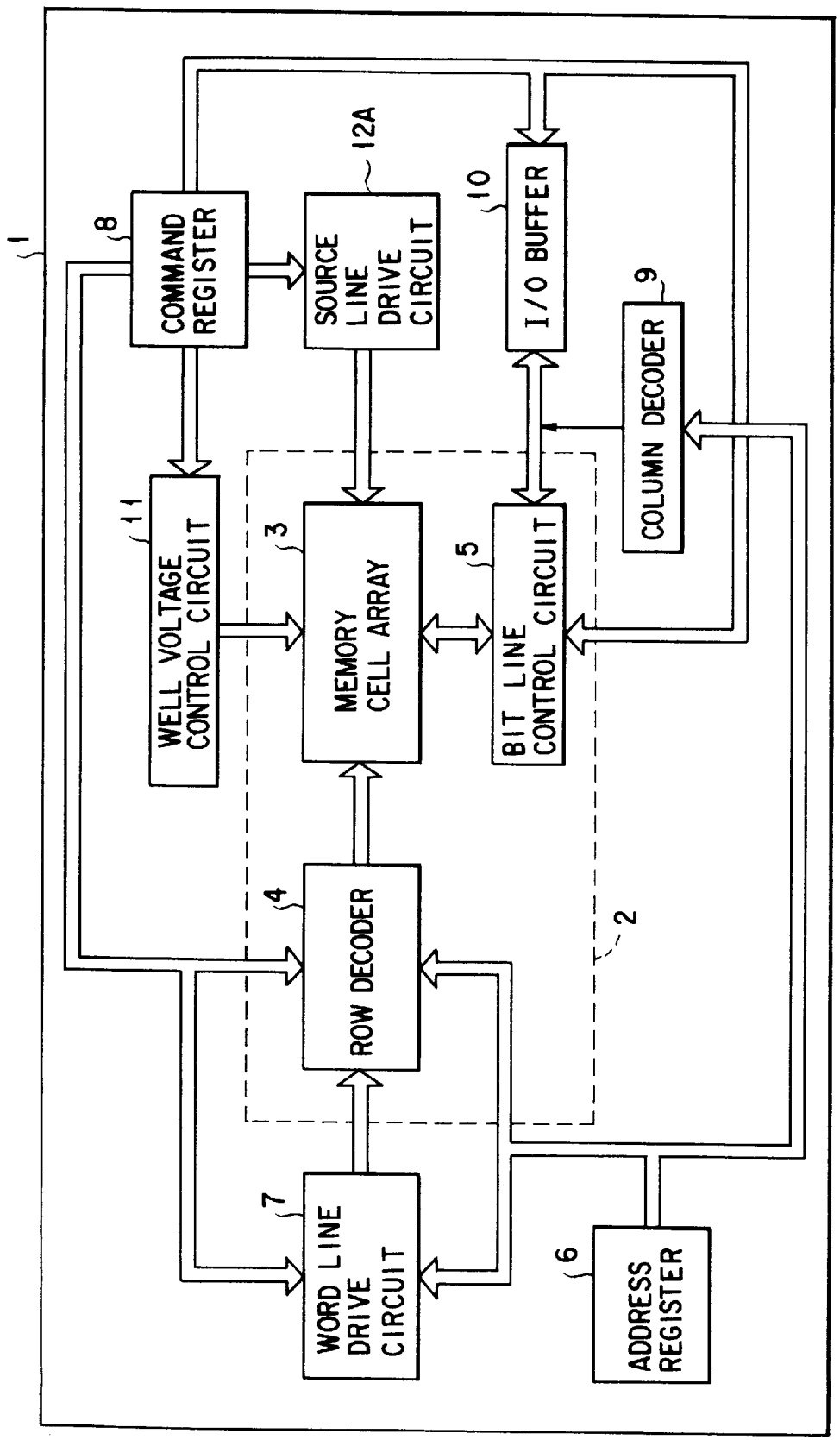
FIG. 4 is a view showing the main part of the structure of a nonvolatile semiconductor memory according to one embodiment of the present invention.

FIG. 4 is a view showing the main part of the structure of a nonvolatile semiconductor memory according to one embodiment of the present invention.

A surface of a memory chip 1 is occupied by a memory core section 2, and a peripheral circuit other than the memory core section 2. The memory core section 2 comprises a memory cell array 3, a row decoder 4, and a bit line control circuit 5 including a sense amplifier 20 (FIG. 6) and a bit line charge circuit.

A memory cell comprises a transistor having a layer gate structure including a floating gate electrode, serving as a charge storage layer and a control gate electrode, serving as a word line.

A row address signal is output from an address register 6 to be supplied to the row decoder 4 and a word line drive circuit 7. The row decoder 4 and the word line drive circuit 7 select a predetermined row of the memory cell array 3 based on a control signal from a command register 8, and apply a high potential to the selected predetermined row.

A column address signal is output to a column decoder 9 from the address register 6. The column decoder 9 selects a predetermined column of a memory cell array 3. Then, a bit line (signal line) 19 (FIG. 6) of the selected predetermined column and an I/O buffer 10 are connected to each other.

A well voltage control circuit 11 sets a voltage of a well where a memory cell is formed to a predetermined value with respect to an operation mode of the nonvolatile semiconductor memory based on the control signal from the command register 8. A source line drive circuit 12A sets a voltage VS of a source of the memory cell to a predetermined value based on the control signal from the command register 8.

Figure 1:
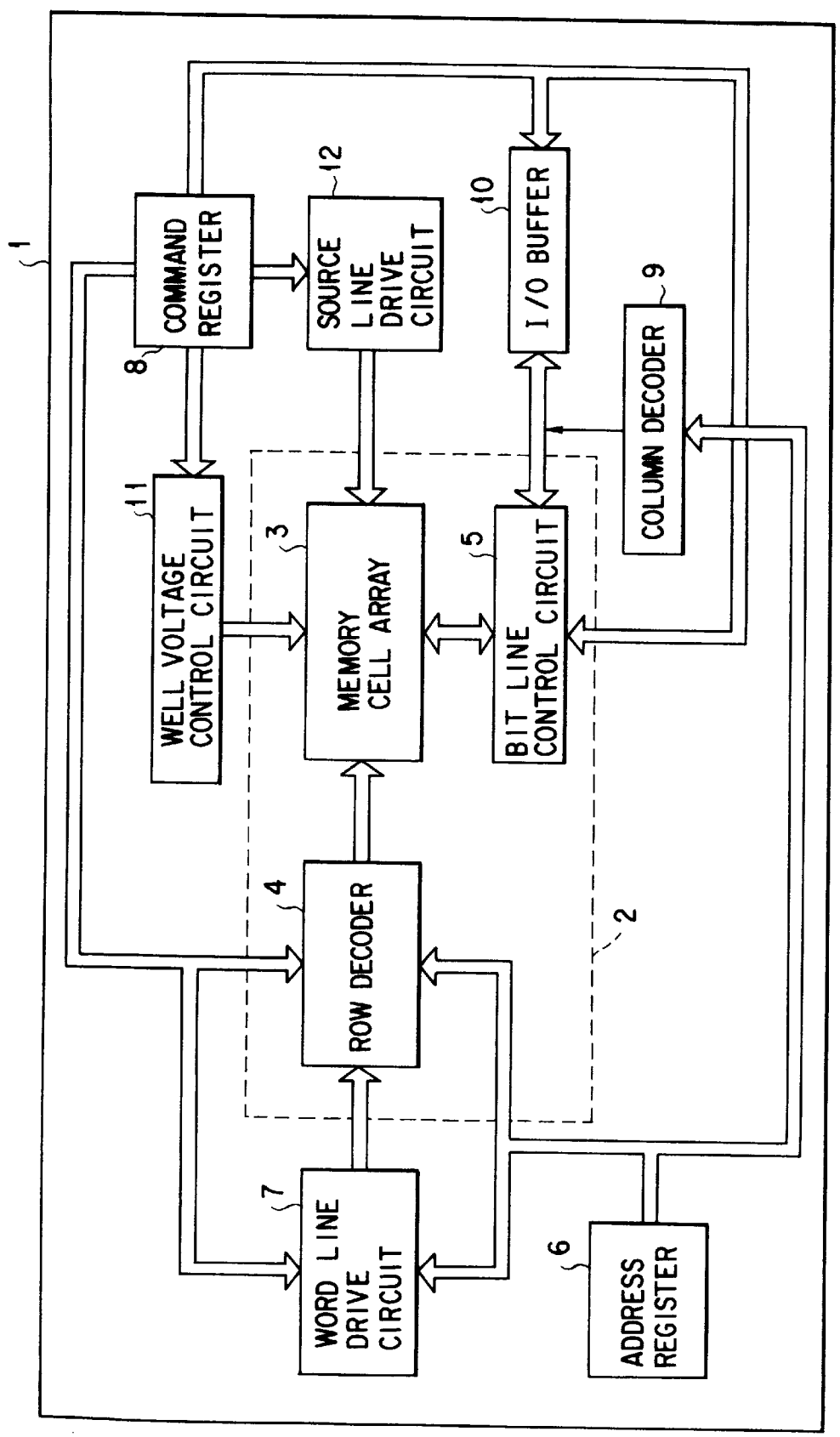
FIG. 1 is a view showing the main part of the structure of a conventional nonvolatile semiconductor memory such as a flash type EEPROM.
Figure 2:
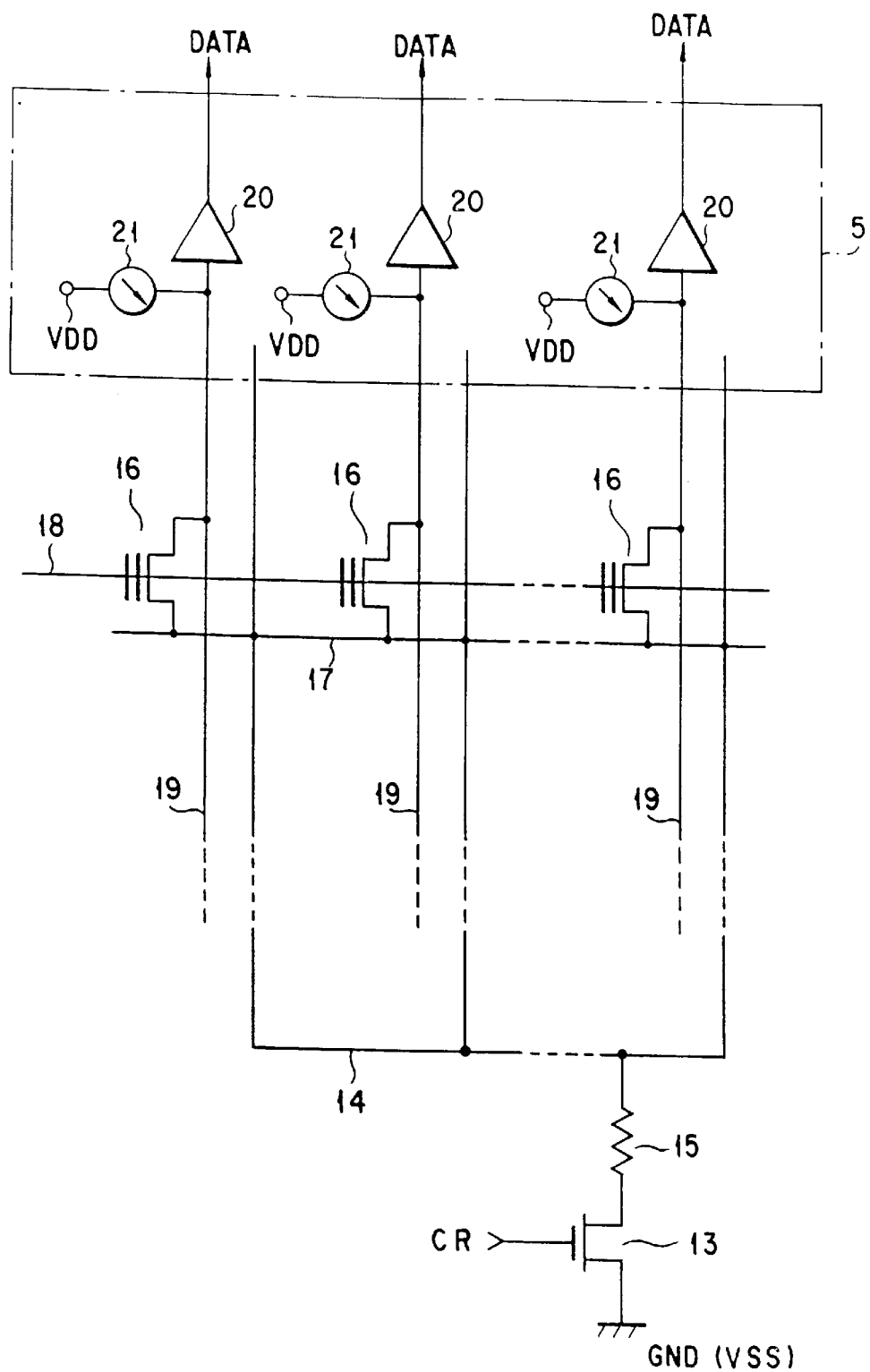
FIG. 2 is a view showing the structure of a conventional source line drive circuit.
Figure 3:
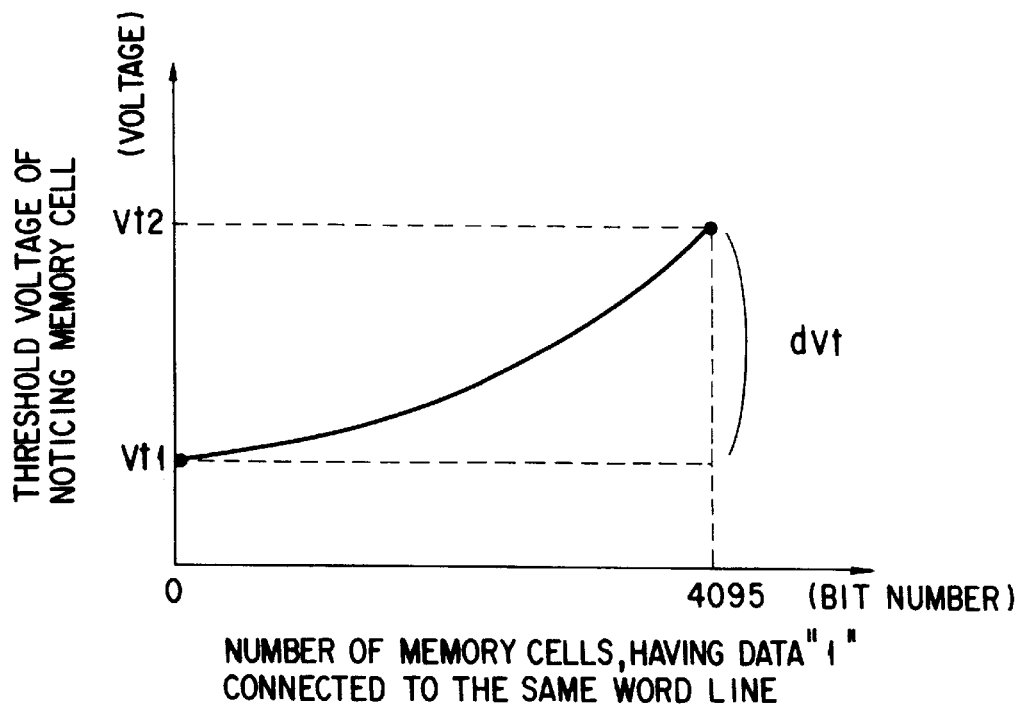
FIG. 3 is a view showing a variation of a threshold voltage of the memory cell.
Figure 5:
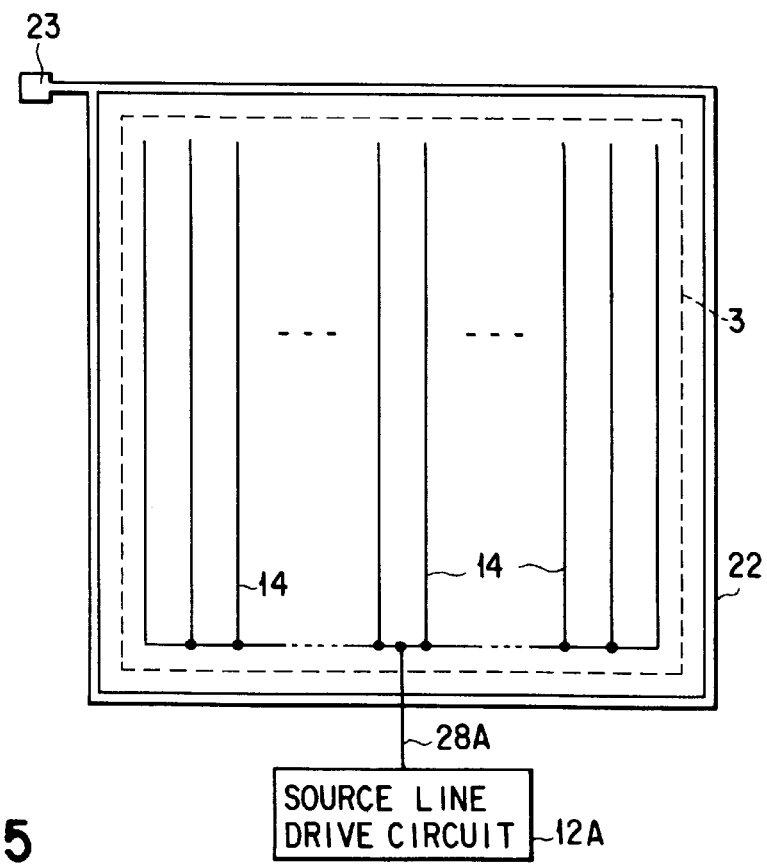
FIG. 5 is a view showing one example of the layout of a memory cell array of FIG. 4.

FIG. 5 is a view showing one example of the layout of a memory cell array of FIG. 4.

On the memory cell array 3, a plurality of source lines 14 are arranged in a line form. Each source line 14 is connected to a source diffusion layer of a memory cell at a predetermined portion. The source lines 14 are connected to each other at one end of each source line, and the entire shape is formed to be comblike.

A power source wire 22 is formed around the memory cell array 3 to surround the memory cell array 3. A power supply potential is supplied to the power source wire 22 from a power source pad 23.

The source line drive circuit 12A is connected to the plurality of source lines 14 on the memory cell array 3 by a first wire 28A (e.g., polysilicon wire) used to intersect with the power source wire 22. The first wire 28A has a wire resistor 15A.

Figure 6:
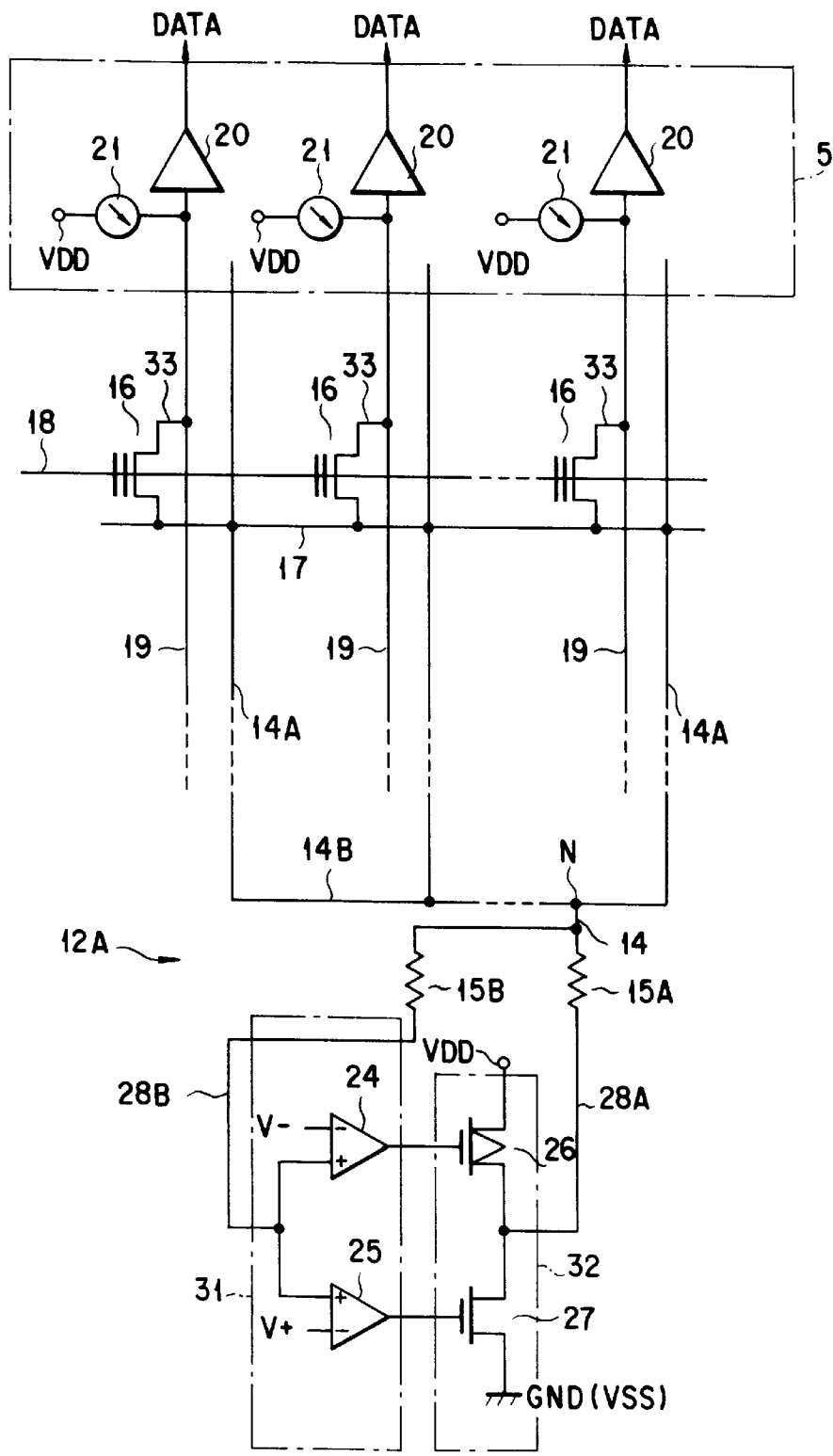
FIG. 6 is a view showing one example of the structure of a source line drive circuit 12A of FIG. 4.

FIG. 6 is a view showing one example of the structure of the source line drive circuit 12A of FIG. 4.

The source line drive circuit 12A comprises a monitor section 31 and a drive section 32. The monitor section 31 comprises two operational amplifiers 24 and 25.

A reference potential V− is applied to a negative input terminal of the operational amplifier 24, and a positive input terminal is connected to the source line 14 through a second wire 28B. The second wire 28B has a wire resistor 15B.

A reference potential V+ is applied to a negative input terminal of the operational amplifier 25, and a positive input terminal is connected to the source line 14 through the wire resistor 15B. In this case, the relationship, V+>V− is established.

The drive section 32 comprises a P channel MOS transistor 26 and an N channel MOS transistor 27. An output signal of the operational amplifier 24 is applied to a gate of the MOS transistor 26. The source of the MOS transistor 26 is connected to the power source terminal VDD of the high potential side. An output signal of the operational amplifier 25 is applied to a gate of the MOS transistor 27. The source of the MOS transistor 27 is connected to the power source terminal GND of the low potential side.

The drains of the MOS transistors 26 and 27 are connected to the source line 14 via the wire resistor 15A. A resistance value of the wire resistor 15A may be set to be low as possible. However, there is no problem in the resistance value of the wire resistor 15B. Normally, the resistance value of the wire resistor 15A is set to be lower than the resistance value of the wire resistor 15B.

The source line 14 is made of metal such as aluminum. A plurality of memory cells 16 share one word line (control gate electrode) 18. Also, the memory cells 16 share one source diffusion layer 17. The source diffusion layer 17 is formed in a line manner in the row direction where the word line extends. Also, the source diffusion layer 17 contacts the source line 14 in the column direction where the bit line extends at a plurality of portions.

The source line 14 comprises a first wire 14A and a second wire 14B connected to the first wire 14A. The first wire 14A extends in substantially the same direction where the bit lines or signal lines of the memory cells 16 extend. The first wire 14A is connected to the source electrodes of the memory cells 16 at a predetermined portion.

A drain diffusion layer 33 of each memory cell 16 is connected to the corresponding bit line 19. Each bit line 19 is connected to a corresponding sense amplifier 20. Constant current sources 21 are connected between the bit lines 19 and power source terminals VDD, respectively to constitute the bit line control circuit 5.

In this case, the first and second wires 28A, 28B may be formed of tungsten or aluminum other than polysilicon.

Figure 7:
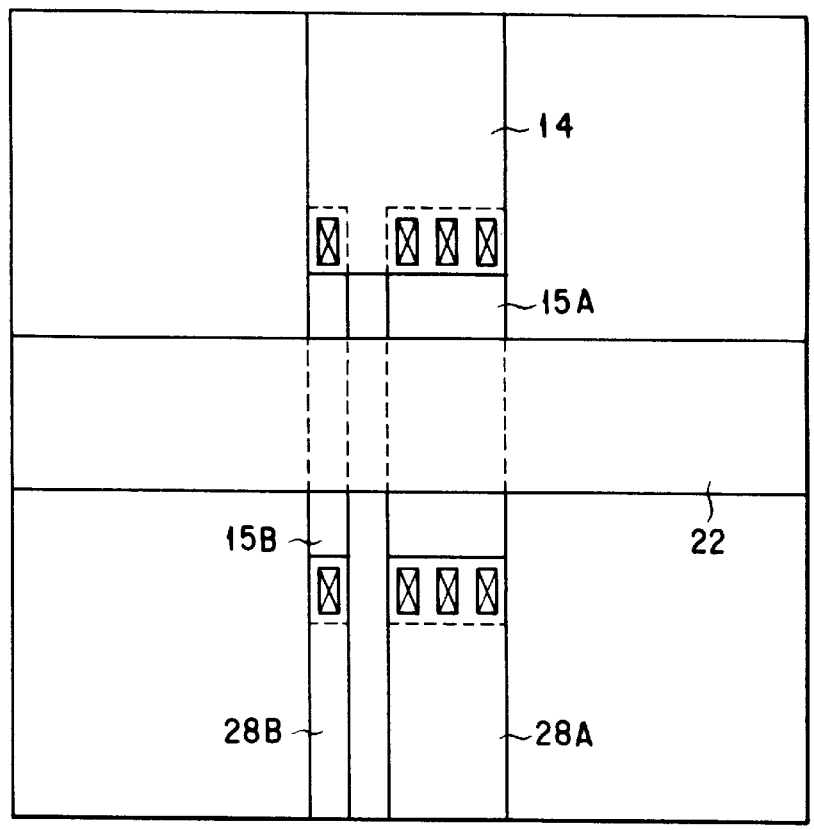
FIG. 7 is a view showing the wire structure for connecting the source line drive circuit 12A of FIG. 6 to a source line 14.

FIG. 7 is a view showing the wire structure for connecting the source line drive circuit 12A of FIG. 6 to the source line 14.

Generally, the power source wire 22, made of metal such as aluminum, is formed around the memory core section. As a result, the source line drive circuit 12A is connected to the source line 14 (metal wire such as aluminum wire) on the memory cell array by the first and second wires 28A and 28B having wire resistors 15A and 15B.

In other words, the power source wire 22 is formed to have the same level as the source line 14 and the first and second wires 28A and 28B (FIG. 6) of the source line drive circuit 12A. As a result, the power source wire 22 and the source line 14 (or wires 28A and 28B of the source line drive circuit side) cannot be intersected with each other on the same level.

Due to this, the polysilicon wires 28A and 28B having the wire resistor 15A and 15B, which are formed on a level lower than the power source wire 22, are connected to the source line 14.

At this time, the polysilicon wires 28A and 28B are formed to be substantially parallel to each other and to have the same wire length.

Thereafter, as shown in FIG. 7, if the wire width of the polysilicon wire, serving as wire resistor 15A, is larger than the width of the polysilicon wire, serving as wire resistor 15B, the resistance value of the wire resistor 15A can be set to be lower than the resistance value of the wire resistor 15B.

Next, the following will explain a data reading operation of the above-explained nonvolatile semi-conductor memory.

First of all, as shown in FIGS. 4 and 6 the row address signal is decoded by the row decoder 4, and the high potential (e.g., 5V) is applied to a predetermined word line 18. Also, the bit line 19 is charged by the constant current source 21.

In a state that data of the memory cells 16 is "0", that is, an electron is stored in a floating electrode, a threshold value of each of the memory cells 16 exceeds 5V. Due to this, even if the high potential is applied to the word line 18, each memory cell is not turned on.

As a result, each bit line 19 is maintained at high potential (data "0") VbH, and the high potential is guided to the I/O buffer 10 via the sense amplifier 20.

On the other hand, in a state that data of the memory cells is "1", that is, the electron is not stored in the floating electrode, the threshold value of each of the memory cells is below 5V. Due to this, if the high potential is applied to the word line 18, the memory cells are turned on. At this time, the source line 14 is set to a predetermined potential (e.g., ground potential) VbL by the source line drive circuit 12A.

As a result, the bit line becomes a predetermined potential (data "1") VbL, and the predetermined potential VbL is guided to the I/O buffer 10 via the sense amplifier 20.

Here, the following will illustrate a case in which almost all data of the memory cells 16 connected to the selected word line 18 is "1":

In this case, since almost all memory cells are turned on, a large amount of current flows to a node N of the source line 14.

As a result, the potential Vs of the node N of the source line 14 rises by the wire resistor 15A.

The potential Vs of the node N is detected by a monitor section 31 shown by FIG. 7.

In other words, the potential Vs is applied to the positive input terminals of the operational amplifiers 24 and 25.

If the potential Vs is higher than a reference potential V+, the output signals of both operational amplifiers 24 and 25 are at H level. As a result, the P channel MOS transistor 26 is turned off, and the N channel MOS transistor 27 is turned on. In other words, the potential Vs of the source line 14 is set to be reduced.

If the potential Vs is lower than the reference potential V+ and higher than the reference voltage V−, the output signal of the operational amplifier 25 is at L level. As a result, the N channel MOS transistor 27 is turned off. In other words, the potential Vs of the source line 14 is set to be the reference potential V+ or less.

If the potential Vs is lower than the reference potential V−, the output signals of both operational amplifiers 24 and 25 are at L level. As a result, the P channel MOS transistor 26 is turned on, and the N channel MOS transistor 27 is turned off. In other words, the potential Vs of the source line 14 is set to be increased.

Moreover, if the potential Vs is higher than the reference potential V− and lower than the reference voltage V+, the output signal of the operational amplifier 24 is at H level. As a result, the P channel MOS transistor 27 is turned off. In other words, the potential Vs of the source line 14 is set to be the reference potential V− or more.

Thus, the potential Vs of the source 14 belongs to the range of V−<Vs<V+. In other words, according to the present invention, the potential of the source line 14 can be set to be within a constant range regardless of the pattern ("1" or "0") of read data.

Figure 8:
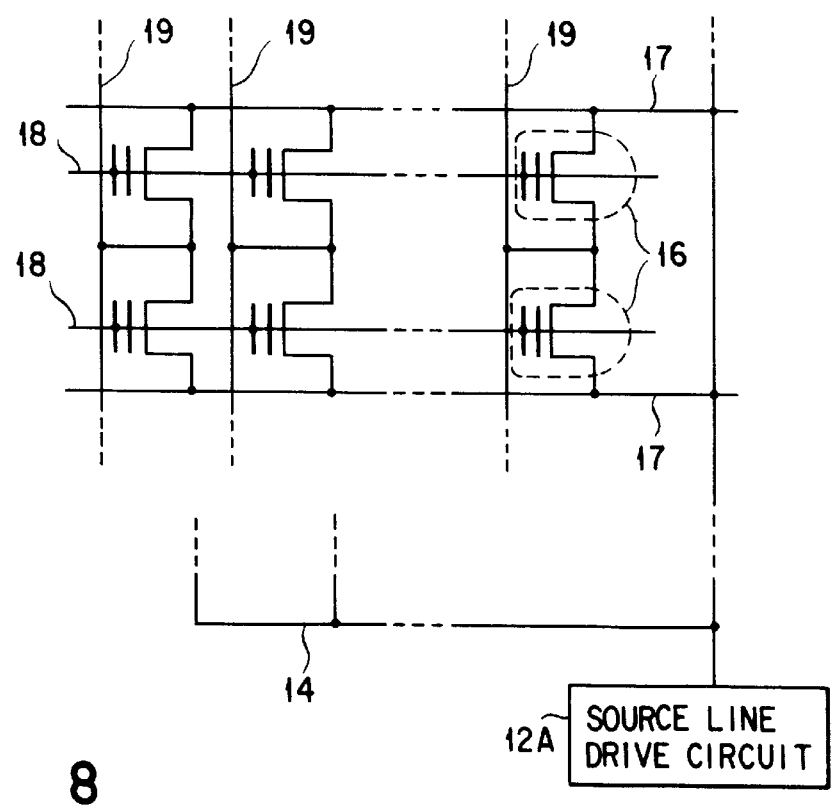
FIG. 8 is a circuit diagram of a NOR type EEPROM in the nonvolatile semiconductor memory of the present invention.

FIG. 8 is a circuit diagram of a NOR type EEPROM in the nonvolatile semiconductor memory of the present invention.

Each gate of the plurality of memory cells 16 is connected to each word line 18. Each drain is connected to a bit line 19 through the drain diffusion layer. Their sources are connected to one source diffusion layer in common. The source diffusion layer 17 and the source line 14 are connected to the source line drive circuit 12A, and the potential Vs of the node N of the source line 14 is controlled.

Figure 9:
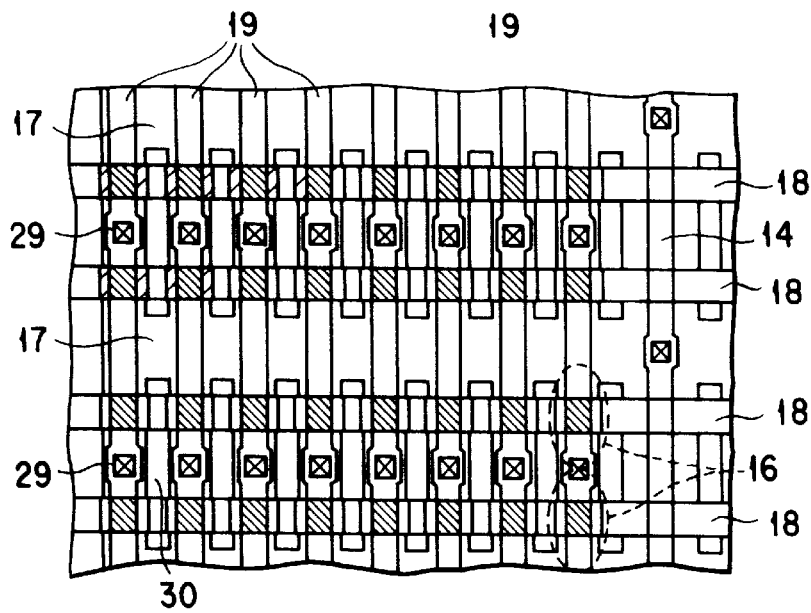
FIG. 9 is a view showing a plane pattern on a memory chip of the NOR type EEPROM of FIG. 8.

FIG. 9 is a view showing a plane pattern on a memory chip of the NOR type EEPROM of FIG. 8.

Two memory cells 16 use one drain diffusion layer in common. The drain diffusion layer is connected to the bit line 19 extending in the column direction via a drain contact hole 29. The memory cells, which use one word line (control gate electrode) 18 in common, share the source diffusion layer 17, which extends in the row direction in a line form.

The source diffusion layer 17 is connected to the source line (aluminum wire) 14 extending in the column direction at a predetermined portion.

The source line drive circuit 12A is connected to the source line 14. The source line drive circuit 12A, which comprises the structure of FIG. 6, sets the potential of the source line 14 to a predetermined range. A reference number 30 is an element separation film for separating the memory cells, which are adjacent in the row direction, from each other.

Figure 10:
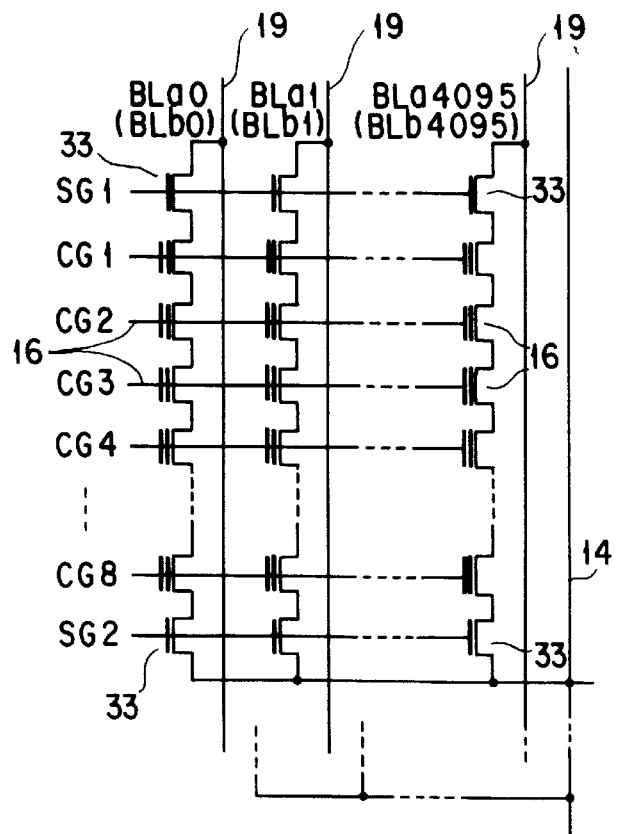
FIG. 10 is a circuit diagram of a NAND type EEPROM in the nonvolatile semiconductor memory of the present invention.

FIG. 10 is a circuit diagram of a NAND type EEPROM in the nonvolatile semiconductor memory of the present invention.

The plurality of memory cells 16, for example, 8 memory cells 16 are serially-connected to each other.

One end of the serially-connected memory cells 16 is connected to the source line 14 via a selection gate (MOS transistor) 33. The other end of the serially-connected memory cells 16 is connected to the bit line 19 via the selection gate (MOS transistor) 33.

The source line drive circuit 12A is connected to the source line 14. The source line drive circuit 12A, which comprises the structure of FIG. 6, sets the potential of the source line 14 to a predetermined range.

As explained above, by improving the source line drive circuit 12A, the nonvolatile semiconductor memory of the present invention can bring about the following advantage:

The source line drive circuit 12A comprises the monitor section 31 and the drive section 32. The monitor section 31 monitors the potential of the source line 14, and the drive section 32 sets the source line 14 to a predetermined potential based on the output signal of the monitor section 31. In other words, according to the nonvolatile semiconductor memory of the present invention, the potential of the source line 14 is maintained within a fixed range regardless of a pattern of read data ("1", "0"). As a result, the margin for recognizing the level of read data can be sufficiently ensured to prevent erroneous data reading.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a memory core section including,
      a memory cell array having a plurality of memory cells respectively constituted by transistors of a layered gate structure having source electrodes, each of said memory cells being connected to a common word line and a corresponding signal line and said source electrodes of said memory cells being connected to a source line in common, and
      a control circuit for sensing a signal line voltage in accordance with data of a corresponding memory cell and amplifying the signal line voltage to output a signal; and
   a source line drive circuit for controlling, in a data reading time, a voltage of the source line to be within a predetermined range in accordance with a voltage change of the source line.

2. A nonvolatile semiconductor memory comprising:
   a memory core section including,
      a memory cell array having a plurality of memory cells constituted by transistors of a layered gate structure having source electrodes, each of said memory cells being connected to a common word line and a corresponding signal line and said source electrodes of said memory cells being connected to a source line in common, and
      a control circuit for sensing a signal line voltage in accordance with data of a corresponding memory cell and amplifying the signal line voltage to output a signal; and
   a source line drive circuit connected to said source line to which a predetermined potential is supplied said source line drive circuit having
      a potential monitor section for monitoring a potential of said source line, said potential monitor section comprising:
         a first operational amplifier having a positive input terminal to which the potential of said source line is applied and a negative input terminal to which a first reference potential is applied; and
         a second operational amplifier having a positive input terminal to which the potential of said source line is applied and a negative input terminal to which a second reference potential is applied; and
      a drive section controlled by an output signal from said potential monitor section comprising:
         first transistor having a gate to which an output signal of the first operational amplifier is applied, a source connected to a first power source terminal, and a drain connected to said source line; and
         a second transistor having a gate to which an output signal of the second operational amplifier is applied, a source connected to a second power source terminal, and a drain connected to said source line.

3. The nonvolatile semiconductor memory according to claim 2, wherein said source line comprises a first wire and a second wire connected to said first wire, said first wire extending in substantially the same direction as said signal lines of the memory cells extend and being connected to said source electrodes of said memory cells at a predetermined portion.

4. The nonvolatile semiconductor memory according to claim 2, wherein said source line is connected to a first line and a second line, said first line being connected between said source line and the drains of said first and second transistors, said second line being connected between said source line and said first and second operational amplifiers, and a resistance value of said first line being lower than a resistance value of said second line.

5. The nonvolatile semiconductor memory according to claim 4, wherein part of said first and second lines are formed of first and second conductive layers respectively, and said first and second conductive layers intersect with a power source wire.

6. The nonvolatile semiconductor memory according to claim 5, wherein said first and second conductive layers are polycrystalline silicon layers, respectively.

7. The nonvolatile semiconductor memory according to claim 5, wherein said first and second conductive layers are formed to be substantially parallel to each other and to have substantially the same wire length, and a width of said first conductive layer wire is larger than a width of said second conductive layer.

8. The nonvolatile semiconductor memory according to claim 2, wherein said second reference potential is greater than said first reference potential, and said second power source terminal has a potential less than a potential of said first power source terminal.

9. The nonvolatile semiconductor memory according to claim 2, wherein said first transistor of said source line drive circuit is a P channel MOS transistor, and said second transistor is an N channel MOS transistor.

10. The nonvolatile semiconductor memory according to claim 2, wherein said potential monitor section of said source line drive circuit comprises said first operational terminal having the negative input terminal to which the first reference potential is applied to determine a lower limit value of said predetermined potential, and said second operational terminal having the negative input terminal to which the second reference potential is applied to determine an upper limit value of said predetermined potential.

11. A nonvolatile semiconductor memory comprising:
   a memory cell array having a source diffusion layer and a drain diffusion layer;
   a row decoder for selecting a row of said memory cell array;
   a source line drive circuit, having a potential monitor section and a drive section, for controlling, in a data reading time, a source line connected to said source diffusion layer to be a predetermined potential, said source line drive circuit setting a potential of said source line within a range between first and second reference potentials at the data reading time regardless of data of a memory cell connected to said row; and
   a sense amplifier for amplifying a potential of a signal line connected to said drain diffusion layer.

12. The nonvolatile semiconductor memory according to claim 11, wherein said potential monitor section comprises a first operational amplifier having a positive input terminal to which the potential of said source line is applied with a negative input terminal to which the first reference potential is applied, and a second operational amplifier having a positive input terminal to which the potential of said source line is applied and a negative input terminal to which the second reference potential is applied.

13. The nonvolatile semiconductor memory according to claim 12, wherein said drive section comprises
   a first transistor having a gate to which an output signal of the operational amplifier is applied, a source connected to a first power source terminal, and a drain connected to said source line, and
   a second transistor having a gate to which an output signal of the second operational amplifier is applied, a source connected to a second power source terminal, and a drain connected to said source line.

14. The nonvolatile semiconductor memory according to claim 13, wherein said source line is connected to a first line and a second line, said first line being connected between said source line and the drains of said first and second transistors, said second line being connected between said source line and said first and second operational amplifiers, and a resistance value of said first line being lower than a resistance value of said second line.

15. The nonvolatile semiconductor memory according to claim 14, wherein part of said first and second lines are formed of first and second conductive layers respectively, and said first and second conductive layers intersect with a power source wire.

16. The nonvolatile semiconductor memory according to claim 15, wherein said first and second conductive layers are polycrystalline silicon layers, respectively.

17. The nonvolatile semiconductor memory according to claim 15, wherein said first and second conductive layers are formed to be substantially parallel to each other and to have substantially the same wire length, and a wire width of said first conductive layer is larger than a wire width of said second conductive layer.

18. The nonvolatile semiconductor memory according to claim 13, wherein said second reference potential is greater than said first reference potential, and said second power source terminal has a potential less than a potential of said first power source terminal.

19. The nonvolatile semiconductor memory according to claim 13, wherein said first transistor of said source line drive circuit is a P channel MOS transistor, and said second transistor is an N channel MOS transistor.

20. The nonvolatile semiconductor memory according to claim 13, wherein said potential monitor section of said source line drive circuit comprises said first operational terminal having the negative input terminal to which the first reference potential is applied to determine a lower limit value of said predetermined potential, and said second operational terminal having the negative input terminal to which the second reference potential is applied to determine an upper limit value of said predetermined potential.

* * * * *